United States Patent [19]

Ito

[11] Patent Number: 5,167,794
[45] Date of Patent: Dec. 1, 1992

[54] METHOD FOR PRODUCING LEAD FRAME MATERIAL

[75] Inventor: Hisatosi Ito, Sagamihara, Japan

[73] Assignee: Mitsubishi Denki Kabushiki Kaisha, Tokyo, Japan

[21] Appl. No.: 680,835

[22] Filed: Apr. 5, 1991

[30] Foreign Application Priority Data

Apr. 16, 1990 [JP] Japan .................................. 2-97626
Apr. 21, 1990 [JP] Japan ................................. 2-106215
Oct. 26, 1990 [JP] Japan ................................. 2-287333

[51] Int. Cl.$^5$ .......................... C25D 7/00; C25D 5/34; C25D 5/50
[52] U.S. Cl. ........................... 205/149; 205/215; 205/224; 205/228; 205/920; 204/129.35; 148/518; 427/328; 427/360; 427/370
[58] Field of Search ................ 205/95, 206, 222, 228, 205/224, 149, 215, 920; 204/129.35, 141.5; 148/11.5 C, 518, 536; 427/360, 370, 328

[56] References Cited

U.S. PATENT DOCUMENTS

| 3,157,539 | 11/1964 | Dreher ............................. 205/228 X |
| 4,270,986 | 6/1981 | Smith .............................. 204/141.5 X |
| 4,521,257 | 6/1985 | Gevatter et al. .................. 205/222 X |

FOREIGN PATENT DOCUMENTS

| 57-57885A | 4/1982 | Japan . |
| 57-57886A | 4/1982 | Japan . |
| 58-87229A | 5/1983 | Japan . |
| 1-17841 | 1/1989 | Japan . |
| 64-17841 | 1/1989 | Japan . |
| 1-257356 | 10/1989 | Japan . |

Primary Examiner—Donald R. Valentine
Attorney, Agent, or Firm—Oblon, Spivak, McClelland, Maier & Neustadt

[57] ABSTRACT

The present invention relates to a lead frame material for a semiconductor, which comprises a copper or copper alloy matrix having a layer obtained by applying an Ag-plating of a thickness of from 0.005 to 0.5 μm on the surface of the matrix and diffusing Ag into the matrix by heat treatment.

4 Claims, 2 Drawing Sheets

7 BURR
6 COPPER ALLOY

METHOD FOR PRODUCING LEAD FRAME MATERIAL

BACKGROUND OF THE INVENTION

1. Field of the Invention

The present invention relates to lead frame material used for semiconductors, integrated circuits (IC) or the like, and a method for producing the same.

2. Discussion of Background

Heretofore, various copper alloys have been used as lead frame material for semiconductors, integrated circuits or the like in view of their high electroconductivity and heat-dissipativity.

FIG. 1 is a perspective view illustrating a lead frame. In FIG. 1, the lead frame 1 comprises a die-pad part 2 on which a semiconductor chip is placed; an inner lead part 3 connected with the semiconductor chip by a wire (Au wire or Cu wire); and an outer lead part 4 bonded with a printed-circuit board.

In this structure, an Ag-plating 5 having a thickness of at least 4 $\mu$m is generally applied on the surface of the inner lead part 3 and the die-pad part 2 on which a semiconductor chip is placed. Without the Ag-plating 5 on the inner lead part 3, the bonding strength of a wire bonding which connects the semiconductor chip and the inner lead part 3 by an Au or Cu wire is not stable and poor in reliability. The die-pad part 2 does not require the Ag-plating 5, but the Ag-plating 5 is applied also on the die-pad part 2 because it is difficult to apply the Ag-plating 5 on the inner lead part 3 only.

However, the above mentioned Ag-plating process has the following disadvantages.

① A manufacturing cost becomes high because expensive Ag is plated in a large thickness of at least 4 $\mu$m.

② When the Ag-plating is carried out, a Cu- or Ni-underplating is applied, but the underplating is applied on the total surface of the lead frame 1 after being formed, and it is therefore necessary to remove the underplating of the outer lead part 4 after molding. Sn-or solder-plating is applied on the outer lead part 4, but when the Sn- or solder-plating is applied on the underplating, i.e. without removing the underplating, it is liable to be peeled off at the interface with the underplating and the reliability of plating is lowered.

Thus, there is a demand for a material suitable for direct wire bonding which connects an Au- or Cu-wire directly with the inner lead part of the surface of the matrix material without conducting thick Ag-plating.

Presently, it is partly practiced to connect a Cu-wire directly with a lead frame. For example, Japanese Unexamined Patent Publication No. 17841/1989 discloses a lead frame material having a Cu-Ag alloy layer of a thickness of at least 0.5 $\mu$m on its surface, which can be used for direct wire bonding.

However, its use is presently limited to semiconductors or IC which do not require high reliability, and more highly reliable lead frame material is demanded for most of semiconductors or IC which require high reliability.

SUMMARY OF THE INVENTION

An object of the present invention is to solve the above mentioned problems and to provide a cheap lead frame material suitable for highly reliable direct wire bonding.

That is, the first object of the present invention is to provide a lead frame material for semiconductors or integrated circuits, which comprises a copper or copper alloy matrix material (hereinafter simply referred to as "copper alloy matrix material") having an Ag-plating of a thickness of from 0.005 to 0.5 $\mu$m on the surface, Ag of said Ag-plating being diffused into the matrix material by heat treatment.

The second object of the present invention is to provide a method for producing a lead frame material used for semiconductors or integrated circuits, which comprises applying an Ag-plating of a thickness of from 0.005 to 0.5 $\mu$m on the surface of a copper alloy matrix material previously finish rolled and heat-treating the plated coatings of Ag to diffuse Ag into the copper alloy matrix material.

The third object of the present invention is to provide a process for producing a lead frame material used for semiconductors or integrated circuits, which comprises electropolishing the surface of a copper alloy matrix material previously finish-rolled, applying an Ag-plating of a thickness of from 0.005 to 0.5 $\mu$m on the electropolished surface of the copper alloy matrix material and heat-treating the plated coatings of Ag to diffuse Ag into the copper alloy matrix material.

DETAILED DESCRIPTION OF THE PREFERRED EMBODIMENTS

Ag is known to be a noble metal highly electroconductive and hardly oxidizable, and is widely used as a bonding metal of a lead frame side in the above mentioned wire bonding. However, when Ag is present in a copper alloy at a concentration of a predetermined amount or more, it achieves effects of preventing the oxidation of the copper alloy and improving the cleanliness of the surface of the copper alloy without forming a uni-layer of Ag such as Ag-plating.

Figure 1:
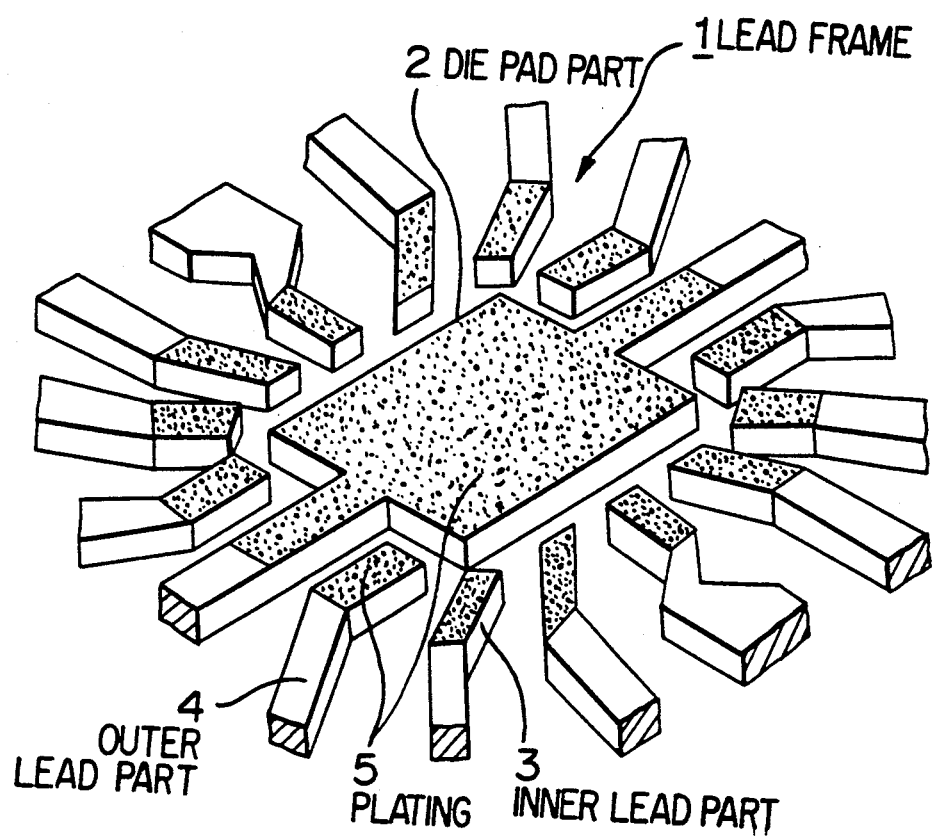
FIG. 1 is a perspective view illustrating a lead frame and FIGS. 2 (a) to (c) are cross-sectional views illustrating the surface of a copper alloy matrix material. In each Figure, the same reference numeral designates the same or corresponding part.
Figure 2A:
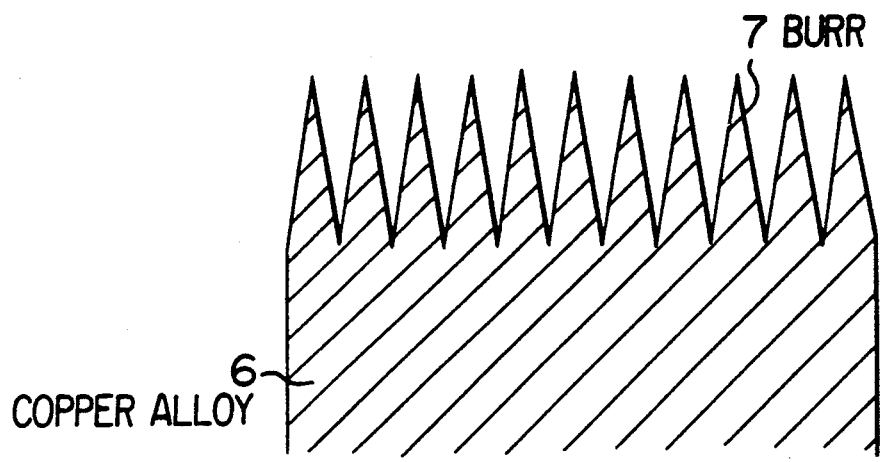
Figure 2B:
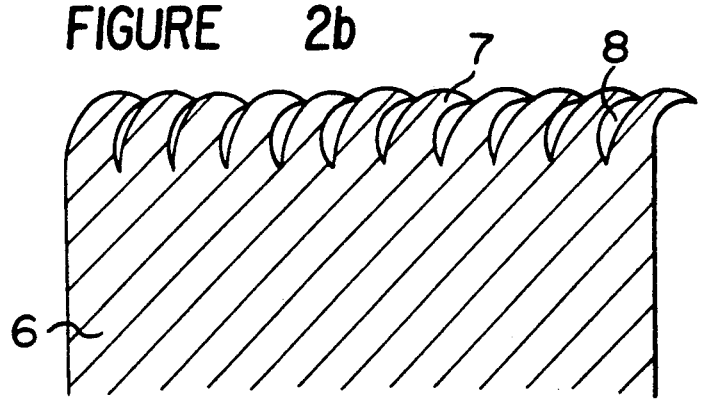
Figure 2C:
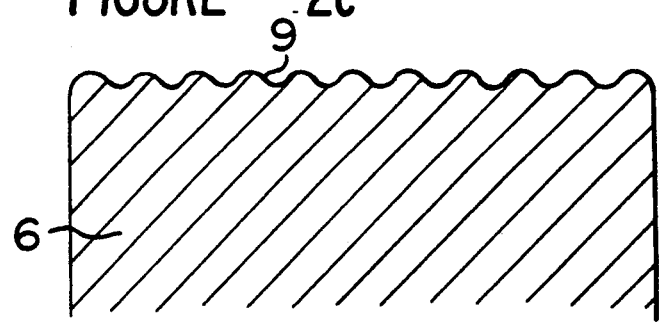

In the production of a copper alloy, the copper alloy may be subjected to mechanical polishing such as buffing with abrasive material after final annealing, and this is to mechanically remove a thick oxide formed on the surface by annealing when the atmosphere is not completely non-oxidative during annealing. However, if the mechanical polishing is conducted, a burr 7 is formed on the surface of the copper alloy 6 as shown in FIG. 2 (a). The burr 7 is pressed by rolling and forms a fine void 8 on the surface as shown in FIG. 2 (b). The void 8 on the surface largely varies depending on the process of mechanical polishing and the processing rate of the final rolling. When the void 8 is large, treating liquors such as oil, a degreasing liquor and the like remain in the void 8, which badly affect on the strength of a bonding part of wire bonding and the adhesiveness of plating.

However, electropolishing has a favorable function preferentially dissolving the burr 7, and it is therefore possible to improve the surface of a finally rolled copper alloy matrix material by electropolishing the surface of the copper alloy 6 to remove the fine burr 7 of about 1 $\mu$m on the surface when the finally rolled copper alloy matrix material of the present invention has the surface state as shown in FIG. 2 (b). Thus, electropolishing after final rolling removes the burr 7 to form a smooth surface 9 as shown in FIG. 2 (c).

A copper alloy matrix material used for a lead frame material in the present invention is not specially limited, but any of lead frame materials generally used may be used.

Plating operation of Ag on a copper alloy matrix is not specially limited, but may be conducted in usual manner. As mentioned above, the thickness of the Ag-plating should be in the range of from 0.005 to 0.5 μm. However, the following heat treatment is indispensably required since the Ag-plating having such a small thickness as mentioned above has many pinhole and is easily removed by mechanical means so as to reveal the matrix. If the thickness of the Ag-plating is less than 0.005 μm, the plating is too thin to achieve its effect. The upper limit of the thickness of the Ag-plating is determined in view of manufacturing cost and the like and is not specially limited, but is suitably about 0.5 μm.

The conditions of the heat treatment such as temperature, time and the like vary depending on the types of copper alloys, but are selected in such a range as to diffuse Ag in the matrix. Generally, the temperature of the heat treatment ranges from 200° to 800° C. and the heat treating time ranges from 10 seconds to 5 hours. If the heat treating temperature is lower, a relatively longer heat treating time is required. On the contrary, if the heat treating temperature is higher, a relatively shorter heat treating temperature will suffice.

If there are voids caused by mechanical polishing on the surface of a matrix, the matrix is preferably subjected to electropolishing to obtain a smooth surface before applying Ag-plating thereon. Thus, the cheap lead frame material excellent in direct wire bonding properties can be provided by applying Ag-plating on the surface of a copper alloy matrix and thereafter subjecting the Ag-plated matrix to heat treatment to diffuse Ag into the matrix.

A copper alloy matrix having the Ag-plated layer subjected to heat-diffusion has a hardly oxidizable and clean surface in comparison with the conventional copper alloy since it contains Ag diffused. Accordingly, the copper alloy matrix thus obtained has a bonding reliability equivalent to a matrix having an Ag-plating of a thickness of 4 μm or more in the direct wire bonding. Moreover, distinct from an ordinary plating, there is no fear that the plated layer is peeled off since Ag is diffused into the matrix. Therefore, an underplating is not necessary and the peeling off step of the underplating after molding can be omitted. Furthermore, plating can be effected in the state of a raw material and a very thin Ag-plating will suffice for the intended effect, thus leading to low material costs and manufacturing costs.

It is preferable to conduct electropolishing before Ag-plating since the electropolishing removes burrs and voids caused by mechanical polishing on the surface of a matrix to obtain a smooth surface, which brings about highly reliable direct wire bonding regardless of the surface state of the matrix.

EXAMPLES

The present invention is further illustrated by the following Examples. In each Example, the composition of a copper alloy is expressed by % by weight.

The following typical copper alloys for lead frame were used as matrix materials.

CA 151 (0.1% Zr, the remainder being unavoidable impurities and Cu)

CA 195 (2.5% Fe, 0.2% Zr, and the remainder being unavoidable impurities and Cu)

MF 202 (2.0% Sn, 0.2% Ni, and the remainder being unavoidable impurities and Cu)

Each of the above matrix materials was subjected to finish-rolling to a thickness of 0.25 mm, degreased, Ag-plated to a thickness of 0.005 μm or 0.01 μm, heat-treated at 300° C. for 2 hours, and fabricated by press to obtain test samples (Examples 1 to 4).

Comparative Examples were respectively prepared by omitting the Ag-plating and heat-treating steps from the above steps (Comparative Examples 1 to 3) or by omitting the heat-treating step from the above steps (Comparative Example 4) or by applying Cu-underplating of 0.3 μm and then Ag plating of 5 μm after finish-rolling, degreasing and fabricating steps in the same manner as in the conventional products (Comparative Examples 5 to 7).

The above prepared test samples of Examples and Comparative Examples were subjected to a reliability test of wire bonding under the following test conditions.

Test Conditions:

① Bonding conditions
Bonding load: 50 g
Stage temperature: 250° C.
Ultrasonic output power: 0.2 W
Ultrasonic wave applying time: 50 msec
Atmosphere: $N_2$
Wire: φ25 μm ② Evaluation Evaluation was made by pulling tests conducted immediately after bonding and heat cycle tests to measure breaking strength and wire breaking rate expressed by the following formula (evaluation was made with regard to 20 test samples).

$$\text{Wire breaking rate (\%)} = \frac{\text{(Total number of test samples} - \text{Number of test samples having broken bonded parts)}}{\text{Total number of test samples}} \times 100$$

③ Heat cycle test

Heat cycle conditions: $-30°$ C. × 30 minutes ⟷ $80°$ C. × 30 minutes

Heat cycle times: 500 times

The test results are shown in the following Table 1.

TABLE 1

| | | | Plating | | | Immediately after bonding | | After heat cycle | | |
|---|---|---|---|---|---|---|---|---|---|---|
| | Matrix material | Electro-polishing | Ag-plating | Under-plating | Heat treatment | Breaking strength | Wire breaking rate | Breaking strength | Wire breaking rate | Note |
| Example 1 | CA195 | none | 0.01 μm | none | 300° C. × 2 hrs. | 9.2 g | 100% | 8.7 g | 100% | |
| Example 2 | CA151 | none | 0.01 μm | none | 300° C. × 2 hrs. | 8.9 g | 100% | 8.5 g | 100% | |
| Example 3 | MF202 | none | 0.01 μm | none | 300° C. × 2 hrs. | 9.0 g | 100% | 8.5 g | 100% | |
| Example 4 | MF202 | none | 0.005 μm | none | 300° C. × 2 hrs. | 9.0 g | 100% | 8.4 g | 100% | |

TABLE 1-continued

|  | Matrix material | Electro-polishing | Plating Ag-plating | Under-plating | Heat treatment | Immediately after bonding Breaking strength | Wire breaking rate | After heat cycle Breaking strength | Wire breaking rate | Note |
| --- | --- | --- | --- | --- | --- | --- | --- | --- | --- | --- |
| Example 5 | MF202 | 20 sec | 0.01 μm | none | 300° C. × 2 hrs. | 9.3 g | 100% | 8.8 g | 100% | Buffing before finishing |
| Comparative Example 1 | CA195 | none | none | none | none | 4.7 g | 20% | 2.8 g | 0% |  |
| Comparative Example 2 | CA151 | none | none | none | none | 4.4 g | 5% | 2.2 g | 0% |  |
| Comparative Example 3 | MF202 | none | none | none | none | 4.5 g | 10% | 2.3 g | 0% |  |
| Comparative Example 4 | MF202 | none | 0.01 μm | none | none | 8.6 g | 100% | 3.8 g | 25% |  |
| Comparative Example 5 | CA195 | none | 5 μm | Cu 0.3 μm | none | 8.4 g | 100% | 8.1 g | 100% |  |
| Comparative Example 6 | CA151 | none | 5 μm | Cu 0.3 μm | none | 8.8 g | 100% | 8.2 g | 100% |  |
| Comparative Example 7 | MF202 | none | 5 μm | Cu 0.3 μm | none | 8.3 g | 100% | 8.0 g | 100% |  |

As can be seen from Table 1, Examples 1 to 4 had breaking strengths immediately after bonding and after heat cycle tests, which are equivalent to those of Comparative Examples 5 to 7 corresponding to the conventional products having thick Ag-platings, and were largely improved in respect of breaking strength as compared with Comparative Examples 1 to 3 having no Ag-plating. Also, the wire breaking rate values of Examples 1 to 4 showed 100% immediately after bonding and after heat cycle tests, while those values of Comparative Examples 1 to 3 were from 5 to 20%, thus proving that Examples 1 to 4 were largely improved as compared with Comparative Examples 1 to 3 in this respect also. Example 5 was electropolished, and showed the reliability equivalent to those of Examples 1 to 4 regardless of the surface state of the matrix, thus proving the effect of electropolishing.

Comparative Example 4 which was not subjected to heat treatment, showed the reliability immediately after bonding equivalent to those of Examples, but the reliability was lowered after heat cycle tests.

As can be seen from the above results, it is necessary for achieving the aimed effect of the present invention to apply Ag-plating of at least 0.005 μm on a matrix and to subject the Ag-plated matrix to heat treatment to diffuse Ag into the matrix. The above results also prove that electropolishing before Ag-plating is effective depending on the surface state of a matrix.

As mentioned above, the present invention can provide a cheap and highly reliable lead frame material by applying Ag-plating of a predetermined thickness on the surface of a copper alloy matrix and diffusing Ag into the matrix by heat treatment, and optionally by electropolishing the surface of a matrix depending on the surface state.

What is claimed is:

1. A process for producing a lead frame material for a semiconductor, which comprises applying an Ag-plating of a thickness of from 0.005 to 0.5 μm on the surface of a copper or copper alloy matrix previously finish rolled, and diffusing Ag into the matrix by heat treatment.

2. The process according to claim 1, wherein the heat treatment is conducted at a temperature of from 200° to 800° C. for 10 seconds to 5 hours.

3. A process for producing a lead frame material for a semiconductor, which comprises electropolishing the surface of a copper or copper alloy matrix previously finish rolled, applying an Ag-plating of a thickness of from 0.005 to 0.5 μm on the electropolished surface and diffusing Ag into the matrix by heat treatment.

4. The process according to claim 3, wherein the heat treatment is conducted at a temperature of from 200° to 800° C. for 10 seconds to 5 hours.

* * * * *